United States Patent
Sakamoto et al.

(10) Patent No.: US 10,811,642 B2
(45) Date of Patent: Oct. 20, 2020

(54) MANUFACTURING METHOD OF DISPLAY DEVICE AND MANUFACTURING APPARATUS OF DISPLAY DEVICE

(71) Applicant: Sharp Kabushiki Kaisha, Sakai, Osaka (JP)

(72) Inventors: Mayuko Sakamoto, Sakai (JP); Shoji Okazaki, Sakai (JP)

(73) Assignee: SHARP KABUSHIKI KAISHA, Sakai (JP)

( * ) Notice: Subject to any disclaimer, the term of this patent is extended or adjusted under 35 U.S.C. 154(b) by 0 days.

(21) Appl. No.: 16/471,003

(22) PCT Filed: Sep. 27, 2017

(86) PCT No.: PCT/JP2017/034915
§ 371 (c)(1),
(2) Date: Jun. 19, 2019

(87) PCT Pub. No.: WO2019/064367
PCT Pub. Date: Apr. 4, 2019

(65) Prior Publication Data
US 2020/0091467 A1    Mar. 19, 2020

(51) Int. Cl.
*H01L 51/56* (2006.01)
*H01L 51/50* (2006.01)
*H01L 51/52* (2006.01)

(52) U.S. Cl.
CPC ............ *H01L 51/56* (2013.01); *H01L 51/502* (2013.01); *H01L 51/5253* (2013.01); *H01L 51/5271* (2013.01)

(58) Field of Classification Search
CPC ... H01L 51/56; H01L 51/502; H01L 51/5253; H01L 51/5271; H01L 27/32; H01L 51/50; H05B 33/02; H05B 33/10; G09F 9/00
(Continued)

(56) References Cited

U.S. PATENT DOCUMENTS

| 2009/0221092 A1* | 9/2009 | Fujita | B01L 3/502707 436/177 |
| 2014/0030833 A1 | 1/2014 | Sato et al. | |

(Continued)

FOREIGN PATENT DOCUMENTS

| JP | 2004-349543 A | 12/2004 |
| JP | 2016-035508 A | 3/2016 |

(Continued)

OTHER PUBLICATIONS

Official Communication issued in International Patent Application No. PCT/JP2017/034915, dated Dec. 5, 2017.

*Primary Examiner* — Vu A Vu
(74) *Attorney, Agent, or Firm* — Keating & Bennett, LLP

(57) ABSTRACT

Provided is a manufacturing method of a display device in which, after a layered body including a resin layer, a TFT layer, and a light emitting element layer is formed on a substrate configured to form a plurality of display devices, the resin layer is irradiated with laser from a back face of the substrate and the substrate is peeled from the layered body using a laser peeling device. The manufacturing method of a display device includes acquiring optical information of the substrate that is peeled off, detecting each acquisition result of the plurality of display devices from each assigned position of the plurality of display devices relative to the substrate, and performing predetermined processing on the display device in a case that the acquisition result of the display device exceeds a threshold value.

15 Claims, 16 Drawing Sheets

(58) Field of Classification Search
USPC .......................................................... 438/22
See application file for complete search history.

(56) References Cited

U.S. PATENT DOCUMENTS

2017/0194605 A1* 7/2017 Kuji ...................... H01L 51/524
2019/0363305 A1* 11/2019 Suga ...................... H05B 33/10

FOREIGN PATENT DOCUMENTS

| JP | 2017-041391 A | 2/2017 |
| WO | 2012/133414 A1 | 10/2012 |

* cited by examiner

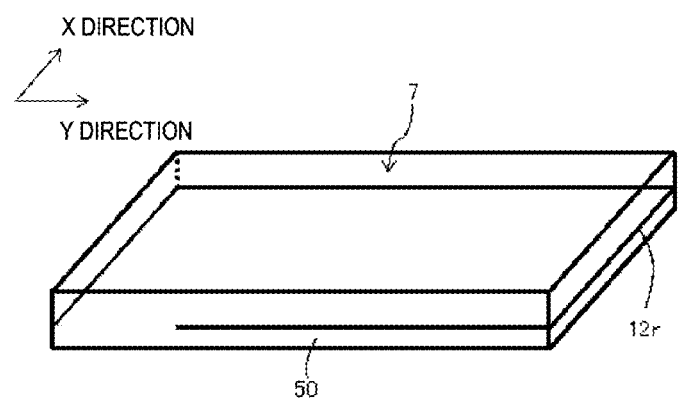
FIG. 5

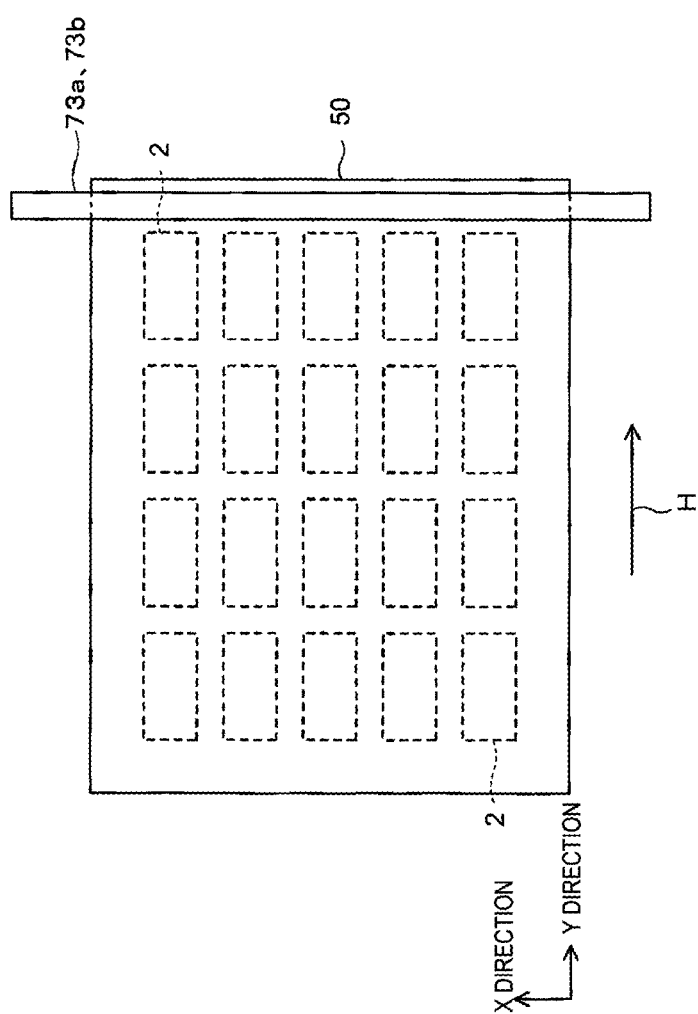

MANUFACTURING METHOD OF DISPLAY DEVICE AND MANUFACTURING APPARATUS OF DISPLAY DEVICE

TECHNICAL FIELD

The disclosure is related to a manufacturing method of a display device, and a manufacturing apparatus of a display device.

BACKGROUND ART

When manufacturing a display device that includes EL elements, for example, a layered body including a resin layer, a TFT layer, a light emitting element layer and the like, is formed on a glass substrate, a lower face of the resin layer is irradiated with laser light from a back face of the glass substrate and the glass substrate is peeled off, and a film is bonded to the lower face of the resin layer.

CITATION LIST

Patent Literature

PTL 1: JP 2004-349543 A

SUMMARY

Technical Problem

In such a manufacturing method of a display device in the related art as described above, a plurality of individual pieces to serve as display devices are formed on the glass substrate (substrate), and a plurality of the display devices are manufactured all at once.

However, when an intensity of the laser irradiated on the lower face of the resin layer varies due to the existence of foreign matter or a damaged portion such as a scratch in a portion of the glass substrate, tearing occurs in the resin layer and defects such as peeling occur in the layered body in a portion of the plurality of individual pieces (display devices), resulting in the occurrence of flaws in the display devices. Further, in the manufacturing method of a display device in the related art described above, an electronic circuit board such as an integrated circuit (IC) chip or a flexible printed circuit (FPC) is mounted on the individual piece before completion of the display device, for example, making it impossible to identify a flaw detectable after completion as a display device.

In light of the above-described problems, an object of the disclosure is to provide a manufacturing method of a display device that allows identification of a display device in which a flaw has occurred due to foreign matter or a damaged portion of a substrate, before completion of the display device, and a manufacturing apparatus of a display device.

Solution to Problem

A manufacturing method of a display device according to an aspect of the disclosure is a manufacturing method of a display device in which, after a layered body including a resin layer, a TFT layer, and a light emitting element layer is formed on a substrate configured to form a plurality of display devices, the resin layer is irradiated with laser from a back face of the substrate and the substrate is peeled from the layered body using a laser peeling device. The manufacturing method of a display device includes acquiring optical information of the substrate that is peeled off, detecting each acquisition result of the plurality of display devices from each assigned position of the plurality of display devices relative to the substrate, and performing predetermined processing on the display device in a case that the acquisition result of the display device exceeds a threshold value.

A manufacturing apparatus of a display device according to another aspect of the disclosure is a manufacturing apparatus of a display device in which, after a layered body including a resin layer, a TFT layer, and a light emitting element layer is formed on a substrate configured to form a plurality of display devices, the resin layer is irradiated with laser from a back face of the substrate and the substrate is peeled from the layered body using a laser peeling device. The manufacturing apparatus of the display device is configured to acquire optical information of the substrate that is peeled off, detect each acquisition result of the plurality of display devices from each assigned position of the plurality of display devices relative to the substrate, and perform predetermined processing on the display device in a case that the acquisition result of the display device exceeds a threshold value.

Advantageous Effects of Disclosure

According to the disclosure, it is possible to provide a manufacturing method of a display device that allows identification of a display device in which a flaw has occurred due to foreign matter or a damaged portion of a substrate, before completion of the display device, and a manufacturing apparatus of a display device.

BRIEF DESCRIPTION OF DRAWINGS

FIG. 5 is a schematic view illustrating a method for irradiating a resin layer of the layered body with laser.

FIG. 9 is a diagram for explaining an acquisition example of specific optical information by the inspection device.

DESCRIPTION OF EMBODIMENTS

Preferred embodiments of a manufacturing method of a display device and a manufacturing apparatus of a display device according to the disclosure will be described hereinafter with reference to the drawings. Note that the following description will be made by giving an example in which the disclosure is applied to an organic EL display device. In addition, in each of the drawings, the dimensions of constituent elements are not precisely illustrated as the actual dimensions of the constituent elements and the dimensional proportions of each of the constituent elements.

First Embodiment

Figure 1:
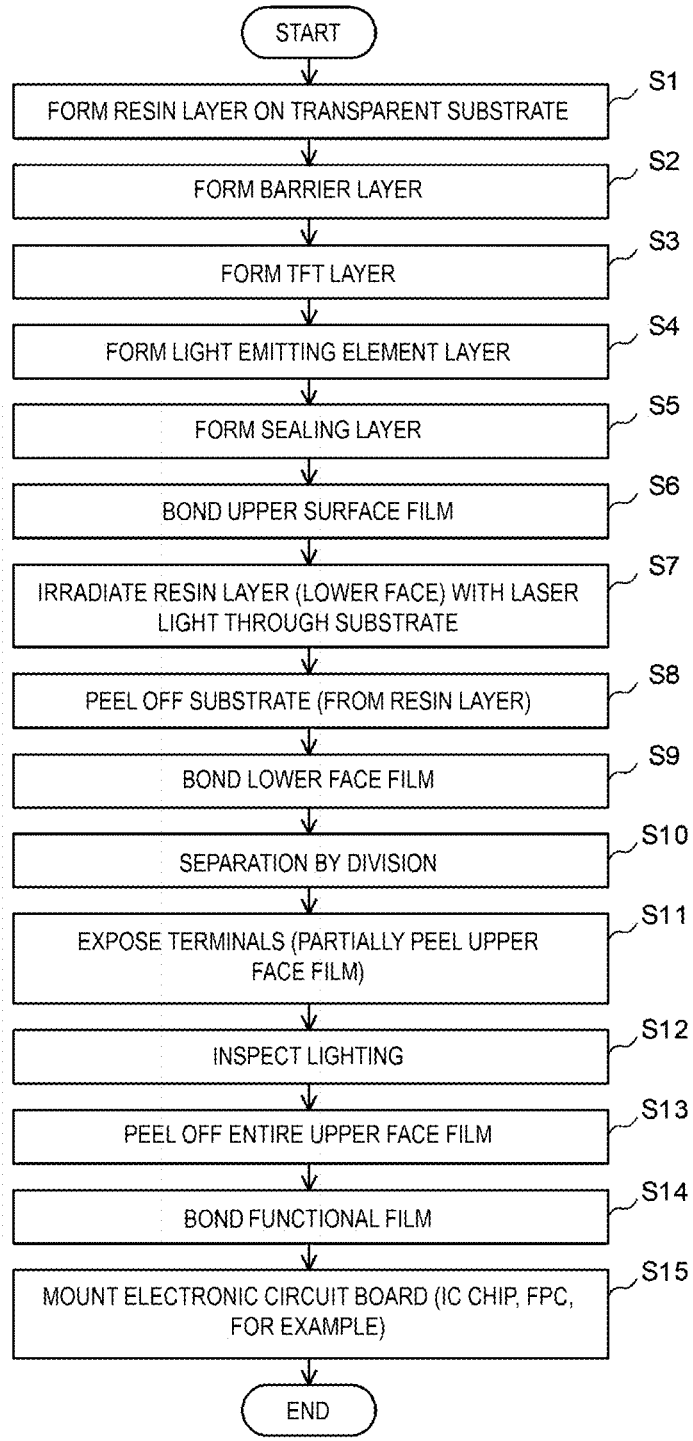
FIG. 1 is a flowchart illustrating a manufacturing method of a display device according to a first embodiment of the disclosure.
Figure 2A:
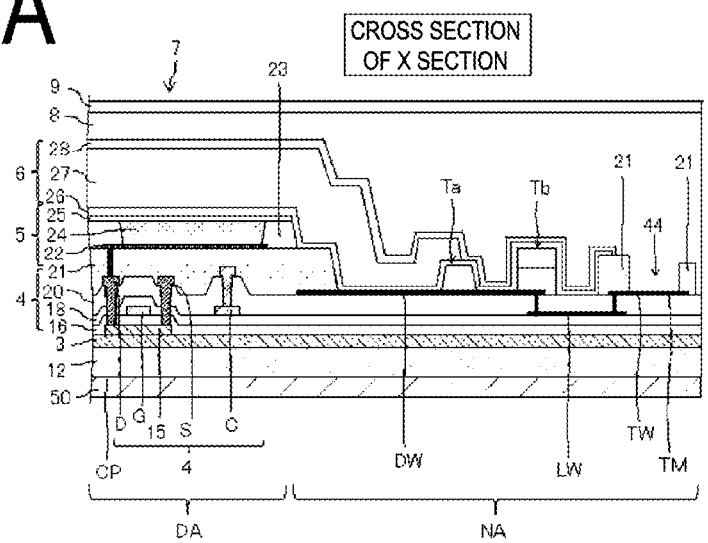
FIGS. 2A and 2B are a cross-sectional view illustrating a configuration (a state in which a layered body is formed on a substrate) of the display device during formation, and a cross-sectional view illustrating a configuration of the display device, respectively.
Figure 2B:
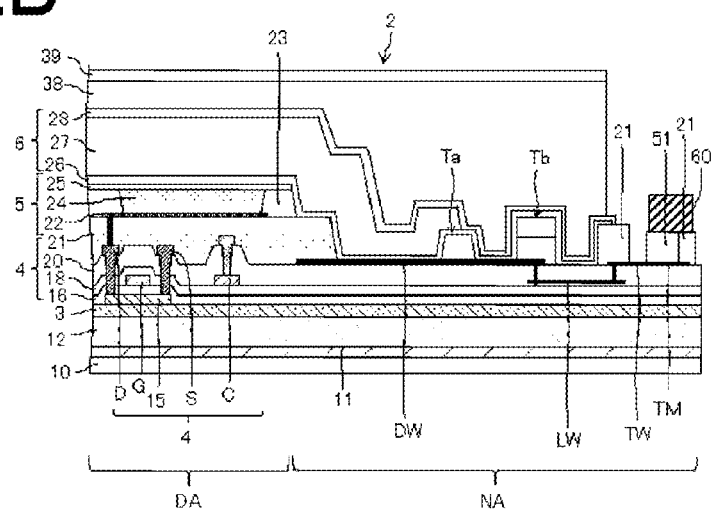
Figure 3:
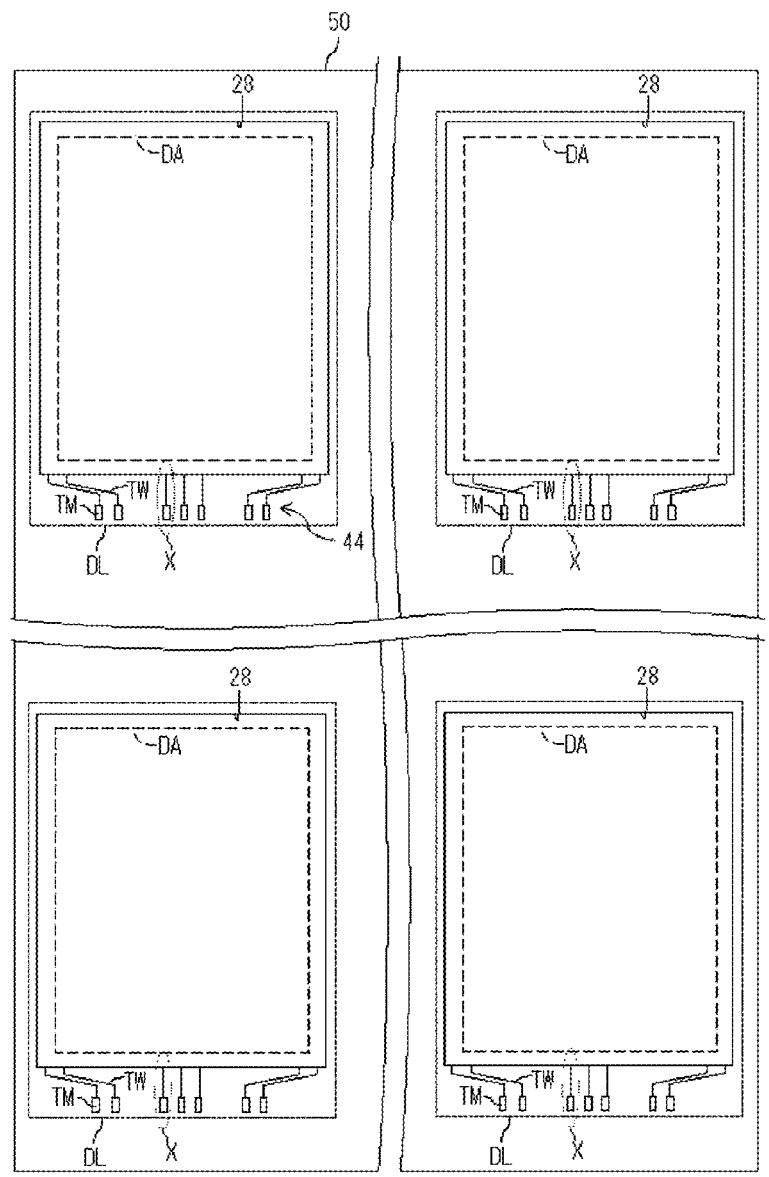
FIG. 3 is a plan view illustrating the configuration (the state in which the layered body is formed on the substrate) of the display device during formation.

FIG. 1 is a flowchart illustrating a manufacturing method of a display device according to a first embodiment of the disclosure. FIG. 2A is a cross-sectional view illustrating a configuration (a state in which a layered body is formed on a substrate) of the display device during formation, and FIG. 2B is a cross-sectional view illustrating a configuration of the display device. FIG. 3 is a plan view illustrating the configuration (the state in which the layered body is formed on the substrate) of the display device during formation.

When the flexible display device is manufactured, as illustrated in FIG. 1, FIG. 2A and FIG. 3, first, a resin layer 12 is formed on a transparent substrate 50 (a mother glass, for example) (step S1). Next, an inorganic barrier film 3 is formed (step S2). Next, a TFT layer 4 is formed (step S3). Next, a light emitting element layer (for example, an OLED element layer) 5 is formed (step S4). Next, a sealing layer 6 is formed (step S2). Next, an upper face film 9 (a PET film, for example) is bonded to the sealing layer 6, with an adhesive layer 8 interposed therebetween (step S6).

Next, the lower face of the resin layer 12 is irradiated with a laser light through the substrate 50 (step S7). Here, the resin layer 12 absorbs the laser light with which the lower face of the substrate 50 has been irradiated and that has passed through the substrate 50, and as a result, the lower face of the resin layer 12 (an interface CP with the substrate 50) alters due to ablation, and a bonding force between the resin layer 12 and the substrate 50 weakens. Next, the substrate 50 is peeled from the resin layer 12 (step S8). Note that the optical information is acquired from an entire face of this substrate 50 that is peeled off (details described later).

Next, as illustrated in FIG. 2B, a lower face film 10 (a PET film, for example) is bonded to the lower face of the resin layer 12, with an adhesive layer 11 interposed therebetween (step S9). Then, a layered body 7 including the lower face film 10, the resin layer 12, the barrier layer 3, the TFT layer 4, the light emitting element layer 5, the sealing layer 6, and the upper face film 9 is divided along cutting lines DL, and a plurality of individual pieces are cut out (step S10). Next, terminal exposure is performed by peeling a part (a section on a terminal portion 44) of the upper face film 9 of the individual piece (step S11). Next, a lighting inspection device (not illustrated) is connected to the terminal and a lighting inspection is conducted on the individual pieces (step S12).

Next, the upper face film 9 is fully peeled (step S13). At this time, both the upper face film 9 and the adhesive layer 8 are fully peeled. Next, a function film 39 is bonded to the upper side of the sealing layer 6 of the individual piece, with an adhesive layer 38 interposed therebetween (step S14). Then, an electronic circuit board 60 is mounted onto the terminal portion 44 of the individual piece, with an anisotropic conductive material 51 interposed therebetween (step S15). In this way, a display device 2 illustrated in FIG. 2B is obtained. Note that each of the above-described steps is performed by a display device manufacturing apparatus (manufacturing apparatus of a display device) described later.

Examples of the material of the resin layer 12 include polyimide, epoxy, and polyamide. Examples of the material used in the lower face film 10 include polyethylene terephthalate (PET).

The barrier layer 3 is a layer that inhibits moisture or impurities from reaching the TFT layer 4 or a light emitting element layer 5 when the display device 2 is being used, and can be constituted by a silicon oxide film, a silicon nitride film, or a silicon oxynitride film, or by a layered film of these, formed using CVD.

The TFT layer 4 includes a semiconductor film 15, an inorganic insulating film 16 (a gate insulating film) formed covering the semiconductor film 15, a gate electrode G formed on the upper side of the inorganic insulating film 16, an inorganic insulating film 18 formed covering the gate electrode G, a capacity wiring line C formed on the upper side of the inorganic insulating film 18, an inorganic insulating film 20 formed covering the capacity wiring line C, a source electrode S and a drain electrode D formed on the upper side of the inorganic insulating film 20, and a flattening film 21 formed covering the source electrode S and the drain electrode D.

A thin film transistor (TFT) is configured to include the semiconductor film 15, the inorganic insulating film 16 (the gate insulating film), and the gate electrode G. The source electrode S is connected to a source region of the semiconductor film 15, and the drain electrode D is connected to a drain region of the semiconductor film 15.

The semiconductor film 15 is formed of, for example, low temperature polysilicon (LTPS) or an oxide semiconductor. The gate insulating film 16 can be formed of, for example, a silicon oxide (SiOx) film, a silicon nitride (SiNx) film, or a layered film thereof formed using a CVD method. The gate electrode G, the source wiring line S, the drain wiring line D, and the terminals are each constituted by a single-layer metal film or a layered metal film including at least one of aluminum (Al), tungsten (W), molybdenum (Mo), tantalum (Ta), chromium (Cr), titanium (Ti), and copper (Cu), for example. Note that, in FIGS. 2A and 2B, the TFT is illustrated that has a top gate structure in which the semiconductor film 15 is the channel, but the TFT may have a bottom gate structure (when the TFT channel is the oxide semiconductor, for example).

The inorganic insulating films 18 and 20 can be formed of, for example, a silicon oxide (SiOx) film or a silicon nitride (SiNx) film, or a layered film of these, formed using CVD.

The flattening film (interlayer insulating film) 21 can be constituted, for example, by a coatable photosensitive organic material, such as a polyimide, an acrylic, or the like.

The terminal portion 44 is provided on an end portion (a non-active region NA) of the TFT layer 4. The terminal portion 44 includes a terminal TM that is used for connecting with an IC chip or the electronic circuit board 60 such as an FPC with the anisotropic conductive material 51 interposed therebetween, and a terminal wiring line TW that is connected to the terminal TM. The terminal wiring line TW is electrically connected to various wiring lines of the TFT layer 4 via a relay wiring line LW and a lead-out wiring line DW.

The terminal TM, the terminal wiring line TW, and the lead-out wiring line DW are formed in the same process as the source electrode S, for example, and thus, are formed in the same layer (on the inorganic insulating film 20) and of the same material (two layers of titanium film and an aluminum film sandwiched between the two layers of titanium film, for example) as the source electrode S. The relay wiring line LW is formed in the same process as the capacitance electrode C, for example. End faces (edges) of the terminal TM, the terminal wiring line TW, and the lead-out wiring line DW are covered by the flattening film 21.

The light emitting element layer 5 (an organic light emitting diode layer, for example) includes an anode electrode 22 formed on the flattening film 21, a bank 23 that defines a subpixel of an active region (display region) DA, an electroluminescence (EL) layer 24 formed on the anode electrode 22, and a cathode electrode 25 formed on the EL layer 24, and a light emitting element (an organic light emitting diode (OLED), for example) is configured by the anode electrode 22, the EL layer 24, and the cathode electrode 25.

The EL layer 24 is formed in a region (a subpixel region) surrounded by the bank 23, by vapor deposition or an ink-jet method. In the case that the light emitting element layer 5 is an organic light emitting diode (OLED) layer, for example, the EL layer 24 is formed by layering a hole injecting layer, a hole transport layer, a light emitting layer, an electron transport layer, and an electron injecting layer from the lower layer side.

The anode electrode (anode electrode) 22 is formed by layering indium tin oxide (ITO) and an alloy containing Ag, for example, and has light reflectivity (described later in more detail). The cathode electrode 25 can be constituted by a light-transmissive conductive material such as indium tin oxide (ITO) and indium zinc oxide (IZO).

In the case that the light emitting element layer 5 is the OLED layer, positive holes and electrons are recombined inside the EL layer 24 by a drive current between the anode electrode 22 and the cathode electrode 25, and light is emitted as a result of excitons that are generated by the recombination falling into a ground state. Since the cathode electrode 25 is light-transmissive and the anode electrode 22 is light-reflective, the light emitted from the EL layer 24 travels upwards and results in top emission.

The light emitting element layer 5 is not limited to OLED element configurations, and may be an inorganic light emitting diode or a quantum dot light emitting diode.

A bulging body Ta and a bulging body Tb that define edges of the organic sealing film 27 are formed in the non-active region NA. The bulging body Ta functions as a liquid stopper when the organic sealing film 27 is applied using an ink-jet method, and the bulging body Tb functions as a backup liquid stopper. Note that a lower portion of the bulging body Tb is configured by the flattening film 21, and the flattening film 21 functions as a protection film for an end face of the lead-out wiring line DW. The bank 23, the bulging body Ta, and an upper portion of the bulging body Tb can be formed in the same process, for example, by using a coatable photosensitive organic material such as a polyimide, an epoxy, or an acrylic.

The sealing layer 6 is light-transmissive, and includes the first inorganic sealing film 26 that covers the cathode electrode 25, the organic sealing film 27 that is formed above the first inorganic sealing film 26, and the second inorganic sealing film 28 that covers the organic sealing film 27.

The first inorganic sealing film 26 and the second inorganic sealing film 28 can be each constituted by a silicon oxide film, a silicon nitride film, or a silicon oxynitride film, or by a layered film of these, formed using CVD. The organic sealing film 27 is thicker than the first inorganic sealing film 26 and the second inorganic sealing film 28, is a light-transmissive organic film, and can be constituted by a coatable photosensitive organic material such as a polyimide, an acrylic, or the like. For example, after coating the first inorganic sealing film 26 with an ink containing such an organic material using the ink-jet method, the ink is hardened by UV irradiation. The sealing layer 6 covers the light emitting element layer 5 and inhibits foreign matter, such as water and oxygen, from infiltrating to the light emitting element layer 5.

Note that the upper face film 9 is bonded onto the sealing layer 6 with the adhesive layer 8 interposed therebetween, and also functions as a support when the substrate 50 is peeled off. Examples of a material of the upper face film 9 include polyethylene terephthalate (PET).

The lower face film 10 is formed of PET or the like, and, by being bonded to the lower face of the resin layer 12 after the substrate 50 has been peeled off, functions as a support material and a protection material.

The function film 39 includes, for example, an optical compensation function, a touch sensor function, a protection function, or the like. Further, the function film 39, after separation of the upper face film 9 and the adhesive layer 8, is bonded onto the sealing layer 6 via the adhesive layer 38. The electronic circuit board 60 is the IC chip or the flexible printed circuit board (FPC) that is mounted on the plurality of terminals TM, for example.

Figure 4:
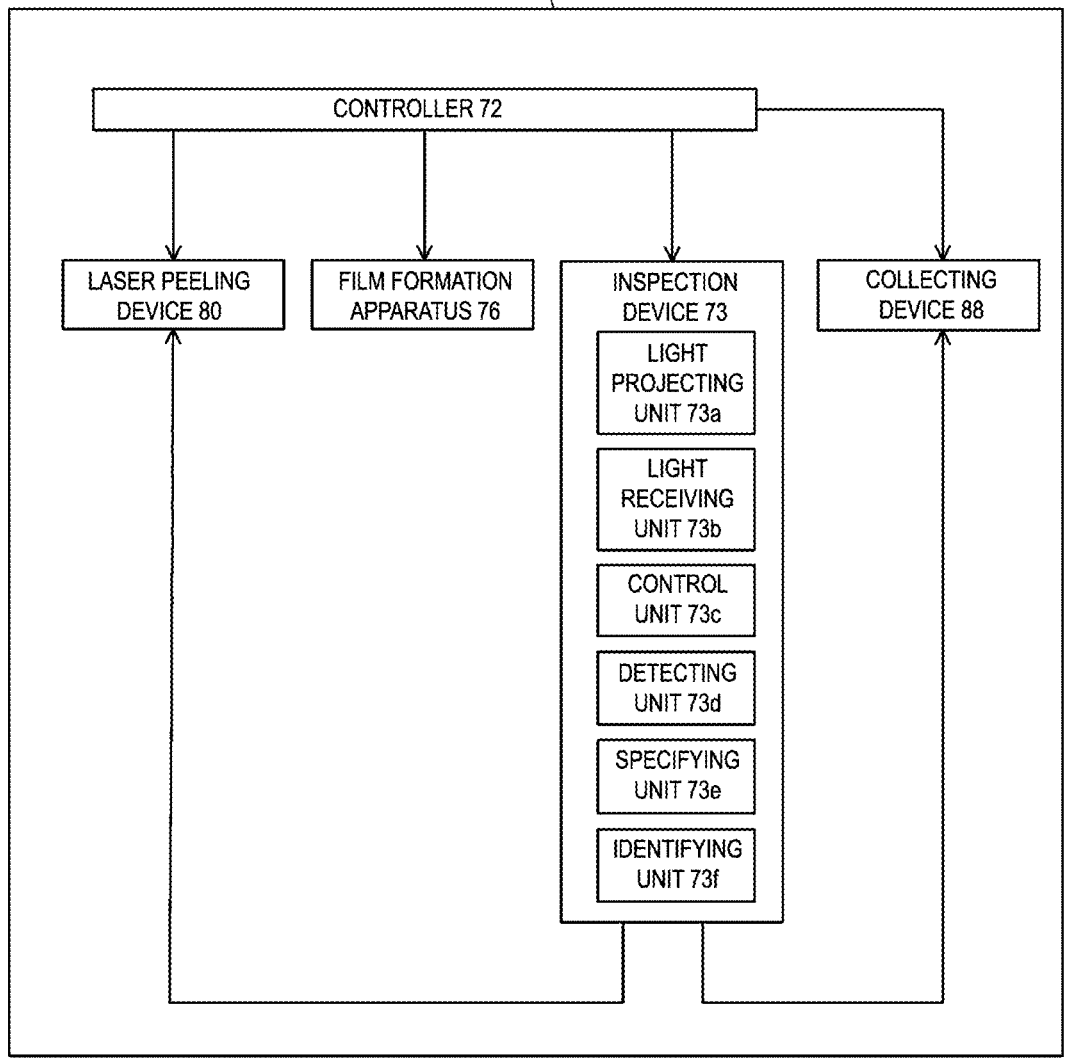
FIG. 4 is a block diagram illustrating a configuration of main portions of a display device manufacturing apparatus of the first embodiment of the disclosure.

Here, a display device manufacturing apparatus 70 of the present embodiment will be specifically described with reference to FIG. 4 to FIG. 12 as well. First, the display device manufacturing apparatus 70 of the present embodiment will be specifically described using FIG. 4. FIG. 4 is a block diagram illustrating a configuration of main portions of the display device manufacturing apparatus of the first embodiment of the disclosure.

As illustrated in FIG. 4, the display device manufacturing apparatus 70 of the present embodiment is equipped with a controller 72 that performs overall control of the display device manufacturing apparatus 70, an inspection device 73 that performs predetermined inspection processing on the substrate 50 peeled off in step S8 described above, a film formation apparatus 76 that performs film formation processing of the sealing layer 6 included in the layered body 7 and the like, and a laser device 77 (FIG. 5) described later, and includes a laser peeling device 80 that performs the peeling processing of the substrate 50 in step S8, and a collecting device 88 that collects the individual pieces identified as defective products.

Further, the inspection device 73 is equipped with a light projecting unit 73a, a light receiving unit 73b, a control unit 73c, a detecting unit 73d, a specifying unit 73e, and an identifying unit 73f. The inspection device 73, as the inspection processing, acquires optical information from the entire face of the substrate 50 that is peeled off, detects each acquisition result of the plurality of individual pieces (display devices) from each assigned position of the plurality of individual pieces relative to the substrate 50, and performs acquisition processing on the individual piece when the acquisition result of the individual piece exceeds a threshold value.

Further, in the inspection device 73, the light projecting unit 73a, the light receiving unit 73b, and the control unit 73c are configured using a photoelectric sensor, for example. Further, in the inspection device 73, transmittance or reflectivity is measured (acquired) as the optical information described above. That is, the light projecting unit 73a emits light onto the entire face of the substrate 50 on the basis of the control of the control unit 73c. Further, when the light projecting unit 73a emits light, the light receiving unit 73b receives the transmitted light transmitted through the substrate 50 or the reflected light reflected by the substrate 50 on the basis of the control of the control unit 73c. The light receiving unit 73b outputs light reception data indicating the amount of transmitted light or reflected light received to the detecting unit 73d.

The detecting unit 73d includes a data processing unit (not illustrated) equipped with a central processing unit (CPU), a microprocessing unit (MPU), an application-specific integrated circuit (ASIC), or the like, and calculates the transmittance or the reflectivity from the light reception data from the light receiving unit 73b. Further, predetermined threshold values are set in the detecting unit 73d for transmittance and reflectivity and, upon detecting an acquisition result (measurement result) exceeding a threshold value, the detecting unit 73d notifies the specifying unit 73e that the acquisition result exceeded the threshold value.

The specifying unit 73e includes a data processing unit (not illustrated) equipment with a CPU, MPU, ASIC, or the like, for example and, when notified that an acquisition result exceeded a threshold value by the detecting unit 73d, specifies the individual piece that indicated the acquisition result exceeding the threshold value from the plurality of individual pieces (that is, the plurality of display devices 2 formed using the substrate 50). Further, the specifying unit 73e acquires position information indicating the position of the specified individual piece on the substrate 50, and outputs the acquired position information to the identifying unit 73f.

The identifying unit 73f includes a data processing unit (not illustrated) equipped with a CPU, an MPU, an ASIC, or the like, and identifies the individual piece indicated by the inputted position information as a defective product when position information is inputted from the specifying unit 73e. Further, the identifying unit 73f notifies the collecting device 88 of the position information of the individual pieces identified as a defective product.

When position information of the individual piece identified as a defective product by the identifying unit 73f is inputted, the collecting device 88 collects the individual piece indicated in the inputted position information and removes the display device that is the defective product.

Figure 6A:
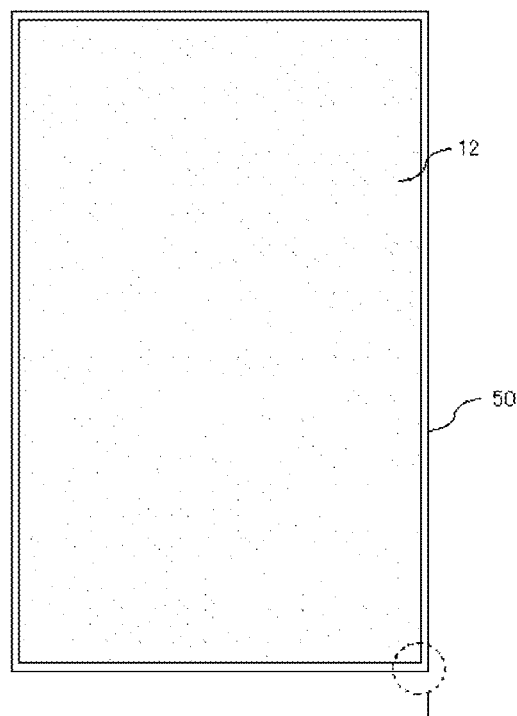
FIGS. 6A and 6B are schematic views illustrating a specific example of separating the substrate and the layered body.
Figure 6B:
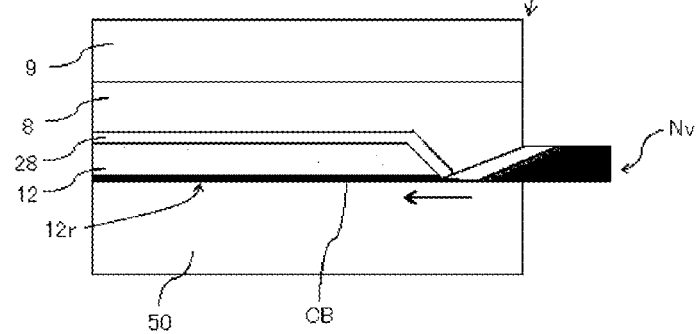

Next, the action of step S7 and step S8 described above by the laser peeling device 80 will be specifically described using FIG. 5 to FIG. 6B. FIG. 5 is a schematic view illustrating a method for irradiating the resin layer of the layered body with laser. FIGS. 6A and 6B are schematic views illustrating a specific example of separating the substrate and the layered body.

As illustrated in FIG. 5, in the present embodiment, after the layered body 7, which includes the resin layer 12, the TFT layer 4, and the light emitting element layer 5, is formed on the transparent substrate 50 by performing the processing of step S1 to step S6 described above, a lower face 12r of the resin layer 12 is irradiated with a laser light La from the back face of the substrate 50 using the laser device 77 included in the laser peeling device 80 in step S7.

In FIG. 5, the laser light La emitted by the laser device 77 is a long thin beam that extends in an x direction, and has substantially the same intensity distribution over the x direction, for example. The lower face of the resin layer 12 is scanned with the laser light La from one end to the other end (in a y direction), and thus laser ablation is performed on the lower face of the resin layer 12.

Next, the laser peeling device 80 performs the peeling processing of the substrate 50, as illustrated in FIGS. 6A and 6B. That is, as illustrated in FIGS. 6A and 6B, the resin layer 12, the inorganic sealing film 28, the adhesive layer 8, and the upper face film 9 are layered near the end face of the substrate 50, and a knife Nv that is inserted from the end face of the layered body 7 is caused to advance underneath the edge of the resin layer 12 on which the laser ablation has been performed, and separate the resin layer 12 and the substrate 50. Note that, a carbide CB is formed on the lower face 12r of the resin layer 12 (the interface CP with the substrate 50) due to the laser ablation.

Note that, while FIG. 6B illustrates the separation processing using the knife Nv in a state when the substrate 50 is on the lower side (action direction side of gravity) relative to the upper face film 9, the present embodiment is not limited thereto and, for example, the separation processing using the knife Nv may be performed in a state when the substrate 50 is on the upper side (side opposite to the action direction side of gravity) relative to the upper face film 9.

Figure 7:
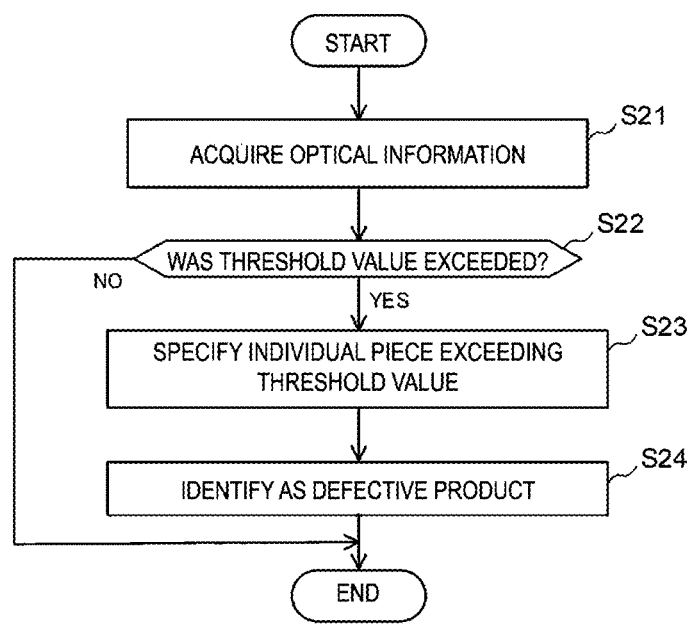
FIG. 7 is a flowchart illustrating an action of an inspection device illustrated in FIGS. 6A and 6B.
Figure 8A:
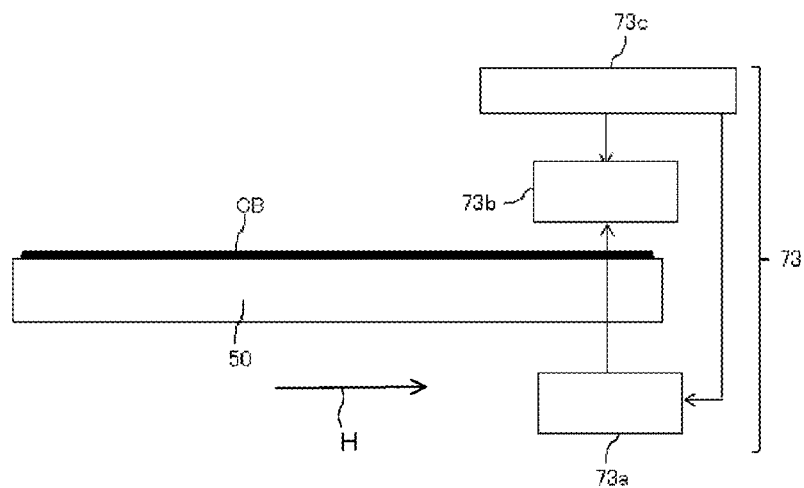
FIGS. 8A and 8B are schematic views illustrating an acquisition example of optical information by the inspection device.
Figure 8B:
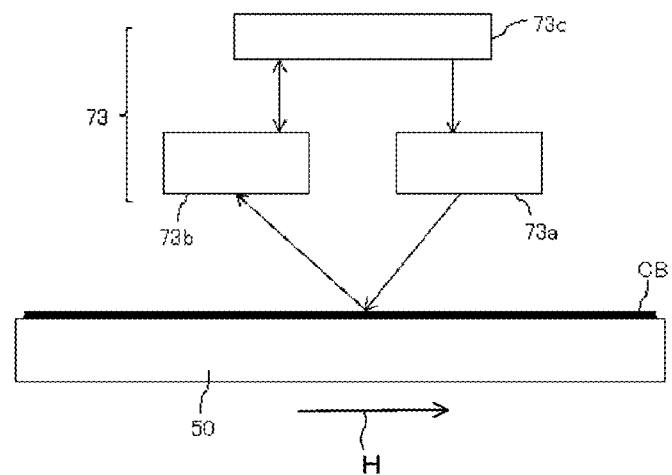

Next, the inspection processing by the inspection device 73 described above will be specifically described using FIG. 7 to FIG. 11. FIG. 7 is a flowchart illustrating an action of the inspection device illustrated in FIGS. 6A and 6B. FIGS. 8A and 8B are schematic views illustrating an acquisition example of optical information by the inspection device. FIG. 9 is a diagram for explaining an acquisition example of specific optical information by the inspection device.

As illustrated in FIG. 7, in the inspection device 73 of the present embodiment, optical information is acquired from the entire face of the substrate 50 that is peeled off in step S8 described above (step S21).

In the inspection device 73 of the present embodiment, when transmittance is measured as the optical information, for example, the light projecting unit 73a and the light receiving unit 73b are disposed sandwiching the substrate 50 as illustrated in FIG. 8A. Further, in the inspection device 73, as illustrated in FIG. 9, transmittance is configured to be measured for the entire face of the substrate 50 transported at a predefined transport speed in an H direction (transport direction of the substrate 50) in FIG. 8A to FIG. 9 by a transport device (not illustrated).

Specifically, as illustrated in FIGS. 8A and 8B, light is projected from the light projecting unit 73a, from the lower face toward the upper face (the face on which the carbide CB is formed) of the substrate 50, and the transmitted light is received by the light receiving unit 73b. Further, as illustrated in FIG. 9, the light projecting unit 73a is configured by a single light source (not illustrated), for example, and the light source emits light toward the substrate 50 by performing a lighting operation in accordance with an instruction signal from the control unit 73c. Further, the light receiving unit 73b includes a plurality of light receiving elements (not illustrated) arranged in an orthogonal direction orthogonal to the transport direction (H direction), and the plurality of light receiving elements perform light receiving operations sequentially or simultaneously in the orthogonal direction in accordance with the instruction signal from the control unit 73c, and output light reception data indicating the amount of transmitted light received for each light receiving element to the detecting unit 73d. Then, the detecting unit 73d calculates the transmittance for each light receiving element on the basis of the light reception data of each light receiving element.

Next, the detecting unit 73d identifies whether or not the calculated transmittance of each light receiving element exceeds the predetermined threshold value (step S22). That is, in step S22, the acquisition results of the plurality of individual pieces (display devices) are detected from the assigned positions of the individual pieces relative to the substrate 50. When the calculated transmittance is 80% or greater, for example, the detecting unit 73d identifies that the threshold value has not been exceeded (NO in step S22), and ends the processing.

On the other hand, when the calculated transmittance is less than 80%, the detecting unit 73d identifies that the threshold value has been exceeded (YES in step S22). Then, the detecting unit 73d notifies the specifying unit 73e by message that the measurement result exceeded the threshold value. Furthermore, the detecting unit 73d outputs, along with the message described above, for example, an elapsed time from the start of transmittance measurement (acquisition of optical information) from the control unit 73c to detection that the threshold value was exceeded, and position information indicating the position of the light receiving element detected as exceeding the threshold value to the specifying unit 73e.

Figure 10A:
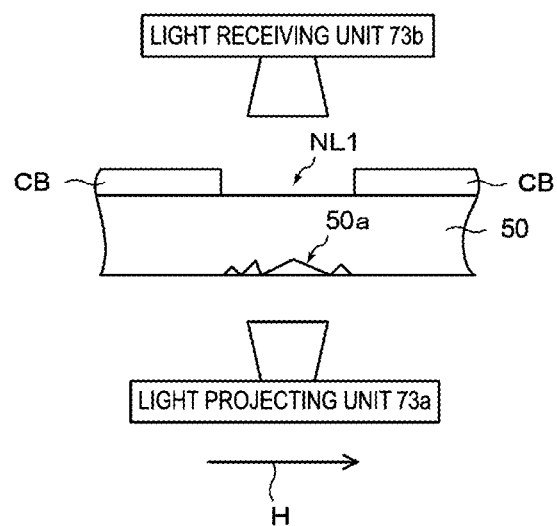
FIGS. 10A and 10B are schematic views illustrating an acquisition example by a light projecting unit and a light receiving unit illustrated in FIGS. 6A and 6B.
Figure 10B:
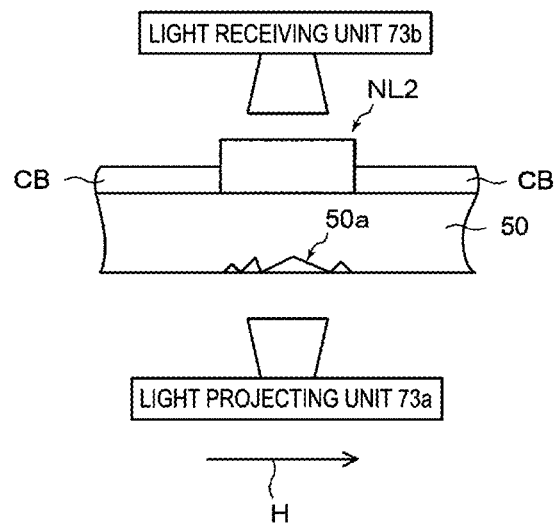
Figure 11:
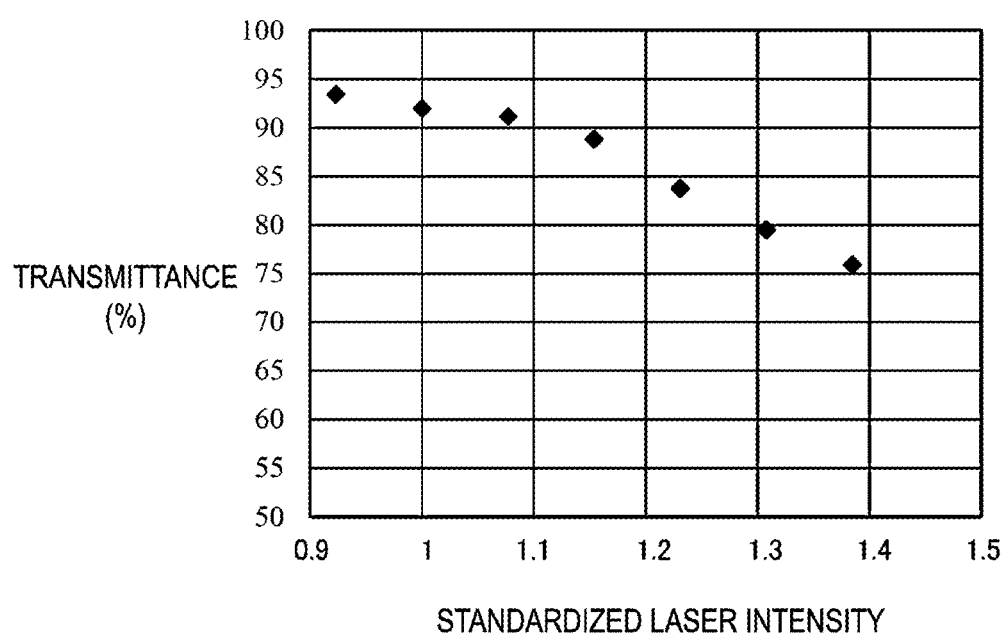
FIG. 11 is a graph showing a relationship between transmittance and laser intensity.

Here, a case that transmittance exceeds the threshold value described above will be specifically described with reference to FIG. 10A to FIG. 11. FIGS. 10A and 10B are schematic views illustrating a measurement example by the light projecting unit and the light receiving unit illustrated in FIGS. 6A and 6B. FIG. 11 is a graph showing a relationship between transmittance and laser intensity.

For example, as illustrated in FIG. 10A, when a damaged portion 50a, such as a scratch, has occurred on a front face on a side opposite to a peeling (layered body 7) side of the substrate 50 and the laser light indicated in step S7 described above is irradiated from the front face on this opposite side, the resin layer 12 is not appropriately irradiated with the laser light due to the damaged portion 50a. Thus, in the portion of the resin layer 12 not appropriately irradiated with the laser light, alterations due to the laser ablation are not appropriately performed, and the portion of the resin layer 12 is forcibly peeled from the substrate 50 in a state when the bonding force between this portion of the resin layer 12 and the substrate 50 has not weakened. As a result, in the substrate 50, as illustrated in FIG. 10A, a non-laser-irradiated region NL1 occurs without the carbide CB remaining on the front face of the substrate 50. In a state when such a non-laser-irradiated region NL1 has occurred, the light from the light projecting unit 73a is refracted and scattered by the damaged portion 50a, for example, decreasing the amount of light received by the light receiving unit 73b and deteriorating transmittance as well. Further, in a state when this non-laser-irradiated region LN1 has occurred, alterations due to the laser ablation are not appropriately performed, and thus a portion of the resin layer 12 peeled in a state of a strong bonding force remains on the substrate 50 side or the like, decreasing the amount of light received by the light receiving unit 73b and deteriorating transmittance as well (not illustrated).

On the other hand, on the layered body 7 (that is, the individual piece) side, similar to the substrate 50 that is peeled off, the above-described portion of the resin layer 12 not appropriately irradiated with laser light occurs as a non-laser-irradiated region NL0 (not illustrated). In the individual piece (that is, the display device 2) including such a non-laser-irradiated region NL0, tearing occurs in the resin layer 12 and peeling occurs in the interior of the layered body 7 and the like due to the resin layer 12 being forcibly peeled, causing defects in the display device 2.

Further, in step S7 described above, when the intensity of the laser light (laser intensity) partially increases due to diffused reflection, variation in the energy of the laser light, or other unexpected defects caused by the damaged portion 50a (when uniform intensity distribution does not exist in the x direction in FIG. 5), for example, an excessive residual carbide region NL2 in which a great amount of the carbide CB remains compared to a region with an appropriate light intensity occurs on the substrate 50, as illustrated by the cross-hatching in FIG. 10B. In a state when such an excessive residual carbide region NL2 has occurred, the amount of light from the light projecting unit 73a received by the light receiving unit 73b is decreased due to, for example, refraction by the damaged portion 50a and the excessive residual carbide region NL2, decreasing transmittance.

On the other hand, on the layered body 7 (that is, the individual piece) side, the resin layer 12 is peeled on the substrate 50 side more than necessary and thus tearing occurs in the resin layer 12 and peeling occurs in the interior of the layered body 7 and the like, causing defects in the display device 2.

Further, according to the inventors of the disclosure, it can be seen that, as the laser intensity increases, the amount of the carbide CB on the substrate 50 increases and the transmittance of the substrate 50 deteriorates, as shown in FIG. 11. Furthermore, it can also be seen that, as the amount of the carbide CB on the substrate 50 increases, the amount of the carbide CB remaining on the lower face 12r of the resin layer 12 after being separated from the substrate 50 also increases. Then, according to the inventors of the disclosure, it is also confirmed that, since the amount of the carbide CB remaining on the lower face 12r of the resin layer 12 can be ascertained by calculating the transmittance as described above, the adhesive force between the lower face film 10 and the resin layer 12 can be secured. Further, it is also confirmed that, when the amount of the carbide CB remaining on the lower face 12r increases in this way, a reduction in the performance of the resin layer 12 and a reduction in adhesive force between the resin layer 12 and the lower face film 10 occur, causing abnormalities and the like on the display device 2. Note that, in FIG. 11, a minimum laser intensity at which peeling of the substrate 50 is possible is assumed to be 1.0.

Note that, other than that which is described above, for example, a configuration in which the light projecting unit 73a and the light receiving unit 73b are disposed above the substrate 50 and reflectivity is measured (acquired) as the optical information, as illustrated in FIG. 8B, is also possible. More specifically, light is projected from the light projecting unit 73a toward the upper face (the face on which the carbide CB is formed) of the substrate 50, and the reflected light is received by the light receiving unit 73b. Then, the detecting unit 73d calculates the reflectivity from the amount of light received by the light receiving unit 73b, and processing similar to that for transmittance is performed.

Note that, other than that which is described above, even when foreign matter exists on (adheres to) the front face on the side opposite the peeling (layered body 7) side of the substrate 50 in place of the damaged portion 50a or along with the damaged portion 50a, the non-laser-irradiated region NL1, the non-laser-irradiated region NL0, or the excessive residual carbide region NL2 occurs.

Returning to FIG. 7, the specifying unit 73e specifies the individual piece indicating an acquisition result exceeding the threshold value from the plurality of individual pieces on the basis of the inputted elapsed time and position information, when the specifying unit 73e inputs the message, the elapsed time and the position information from the detecting unit 73d (step S23). Furthermore, the specifying unit 73e acquires the position information indicating the position of the specified individual piece on the substrate 50, and outputs the acquired position information to the identifying unit 73f.

The identifying unit 73f identifies that the individual piece indicated by the position information is a defective product on the basis of the position information inputted from the specifying unit 73e (step S24). Further, the identifying unit 73f notifies the collecting device 88 of the position information of the individual piece identified as a defective product.

Further, in the display device manufacturing apparatus 70 of the present embodiment, when the identifying unit 73f identifies a defective product, the control unit 73c, for example, notifies an external source that the acquisition result of the individual piece identified as a defective product exceeds the threshold value and of information indicating the individual piece using a display portion, a speaker, or the like (not illustrated). As a result, the manufacturer or the like can be notified that, among the plurality of display devices 2 formed using the substrate 50, the display device 2 having the defect and not usable as a product has occurred.

Figure 12:
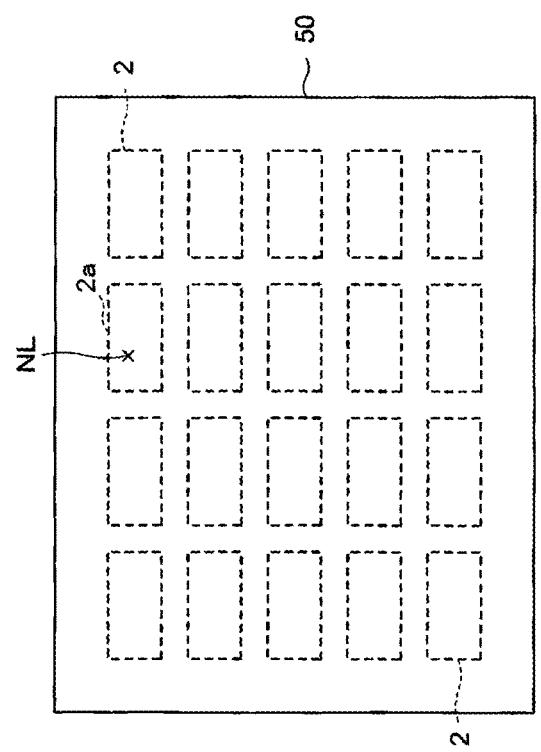
FIG. 12 is a schematic view illustrating a collection example by a collecting device illustrated in FIGS. 6A and 6B.

Further, in the display device manufacturing apparatus 70 of the present embodiment, when position information on the individual piece identified as a defective product by the identifying unit 73f is inputted, the collecting device 88 collects the individual piece indicated in the inputted position information and removes the display device that is the defective product. For example, as illustrated in FIG. 12, when the region NL having an acquisition result exceeding the threshold value is detected by the detecting unit 73d, the specifying unit 73e specifies a display device 2a including the region NL, and the identifying unit 73f identifies the display device 2a as a defective product. Then, the collecting device 88 performs separation by division in step S10 described above and, before the processing of terminal exposure in step S11 described above, collects the display device 2a (individual piece) identified as a defective product. As a result, in the present embodiment, it is possible to prevent the processing after and including step S11 from being performed on an individual piece identified as a defective product, and reduce manufacturing cost while improving the manufacturing yield of the display device 2. Note that the region NL is a region in which the non-laser-irradiated region NL1 or the excessive residual carbide region NL2 has occurred.

As described above, in the present embodiment, predetermined optical information is acquired for all faces of the substrate 50 that is peeled, and predetermined processing is performed in accordance with the acquisition result of each individual piece. Thus, according to the present embodiment, it is possible to identify the display device 2a in which a flaw caused by foreign matter or the damaged portion 50a of the substrate 50 has occurred before completion of the display device 2.

Further, according to the present embodiment, the optical information is acquired for the entire face of the substrate 50 that is peeled and not the layered body 7 side and thus, unlike a case that the layered body 7 side is inspected, adherence of foreign matter on the layered body 7 side can be prevented when the optical information is acquired, making it possible to prevent the occurrence of problems such as a decrease in a manufacturing yield of the display device 2 caused by adherence of foreign matter.

Second Embodiment

Figure 13:
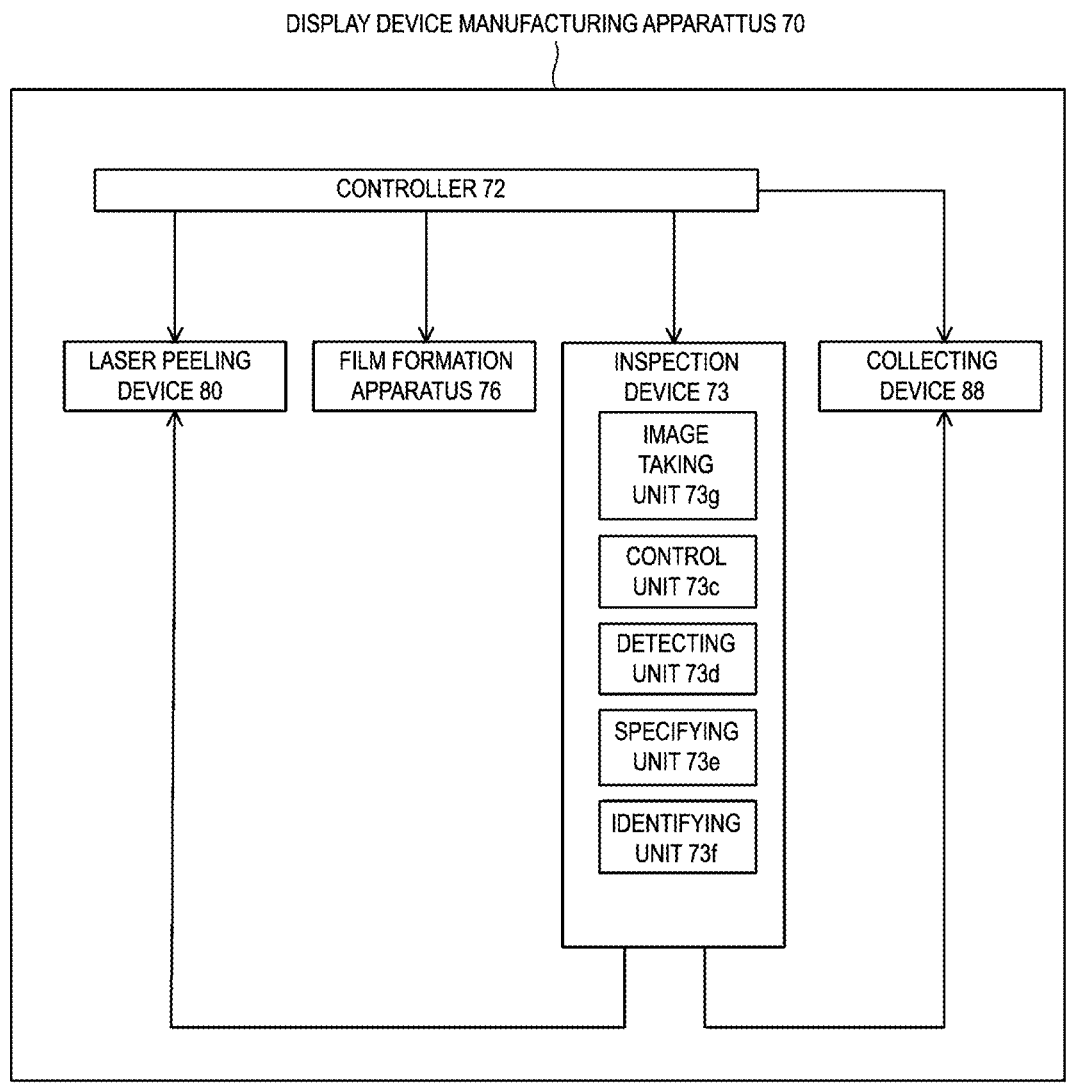
FIG. 13 is a block diagram illustrating a configuration of main portions of the display device manufacturing apparatus of a second embodiment of the disclosure.

FIG. 13 is a block diagram illustrating a configuration of main portions of the display device manufacturing apparatus of a second embodiment of the disclosure.

In the drawing, the main difference between the present embodiment and the first embodiment described above is that the present embodiment is configured to acquire image data as the optical information in place of transmittance and reflectivity. Note that elements common to those in the first embodiment are denoted by the same reference signs, and duplicated description thereof will be omitted.

That is, in the display device manufacturing apparatus 70 of the present embodiment, an image taking unit 73g that takes images of the substrate 50 that is peeled is provided to the inspection device 73 in place of the light projecting unit 73a and the light receiving unit 73b in the first embodiment. Then, in the inspection device 73 of the present embodiment, the image data taken by the image taking unit 73g is acquired as the optical information described above.

Specifically, the image taking unit 73g includes a camera described later provided with a charge-coupled device (CCD), a contact image sensor (CIS), or the like, and takes images of the substrate 50 from which the layered body 7 was peeled on the basis of the control of the control unit 73c. The image taking unit 73g outputs the image data of the substrate 50 that is peeled to the detecting unit 73d. For example, the image taking unit 73g outputs the image data described above made of a pixel value (pixel value on a 256 gray scale) of 8 bits of pixel units taken by the camera to the detecting unit 73d.

When image data is inputted from the image taking unit 73g, the detecting unit 73d applies known image processing technology (pattern matching, for example) to the inputted image data, and detects whether or not the non-laser-irradiated region NL1 or the excessive residual carbide region NL2 occurred on the substrate 50. Specifically, predetermined threshold values (pixel value and size described later) are set in the detecting unit 73d for the pixel value and, upon detecting an acquisition result (image taking result) exceeding a threshold value, the detecting unit 73d notifies the specifying unit 73e that the acquisition result exceeded the threshold value.

More specifically, the detecting unit 73d identifies whether or not pixels having a pixel value of a pixel unit included in the image data from the image taking unit 73g that is greater than the predetermined threshold value exist. Furthermore, when the detecting unit 73d identifies that pixels having a value greater than the threshold value exists, and identifies that the size of the region of the pixels (that is, the number of pixel adjacent to each other, each having a pixel value greater than the threshold value) is greater than a predetermined size (threshold value), the detecting unit 73*d* detects that the non-laser-irradiated region NL1 or the excessive residual carbide region NL2 has occurred on the substrate 50 (that is, the detecting unit 73*d* identifies whether or not the non-laser-irradiated region NL1 or the excessive residual carbide region NL2 has occurred by pattern matching the image data), and then notifies the specifying unit 73*e* that an acquisition result exceeding the threshold value, that is, that the non-laser-irradiated region NL1 or the excessive residual carbide region NL2, has occurred on the substrate 50.

The specifying unit 73*e*, when notified by the detecting unit 73*d* that an acquisition result exceeded the threshold value (that a non-laser-irradiated region NL1 or an excessive residual carbide region NL2 has occurred on the substrate 50), specifies the individual piece that indicated the acquisition result exceeding the threshold value from the plurality of individual pieces (that is, the plurality of display devices 2 formed using the substrate 50). Further, the specifying unit 73*e* acquires position information indicating the position of the specified individual piece on the substrate 50, and outputs the acquired position information to the identifying unit 73*f*.

When the position information is inputted from the specifying unit 73*e*, the identifying unit 73*f* identifies that the individual piece indicated by the inputted position information is a defective product. Further, the identifying unit 73*f* notifies the collecting device 88 of the position information of the individual piece identified as a defective product.

Figure 14:
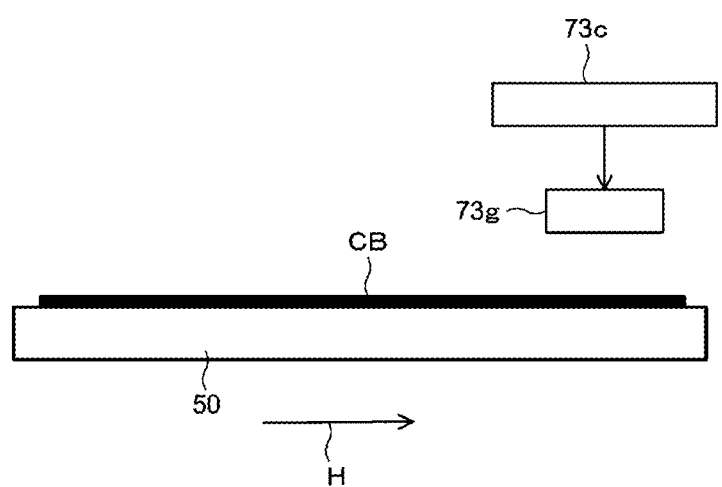
FIG. 14 is a schematic view illustrating an acquisition example of optical information by the inspection device illustrated in FIG. 13.
Figure 15:
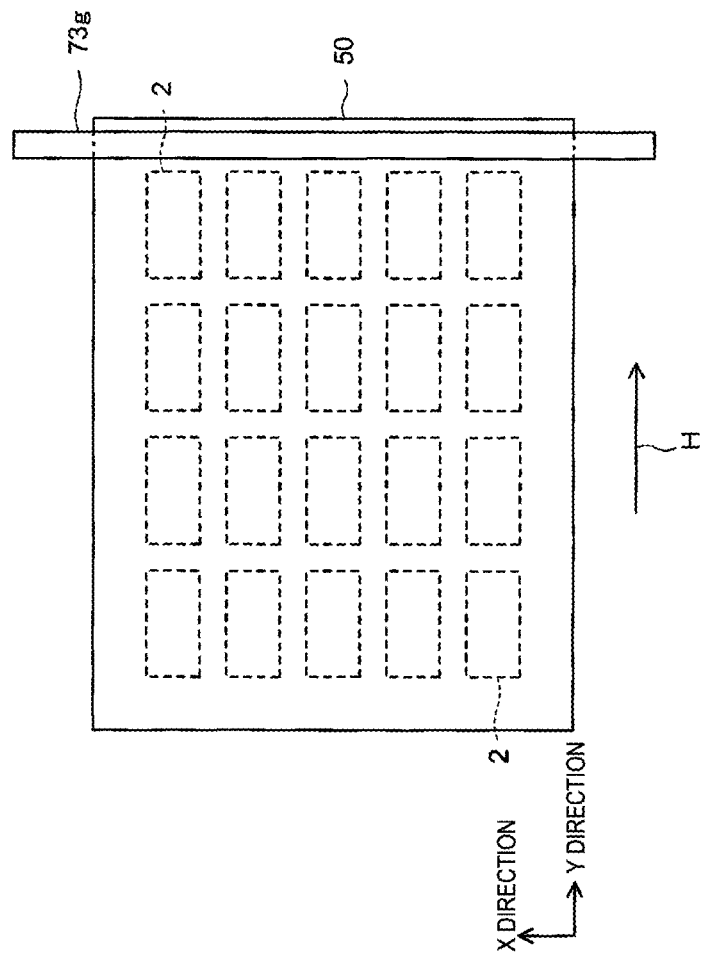
FIG. 15 is a diagram for explaining an acquisition example of specific optical information by the inspection device illustrated in FIG. 13.

Next, the inspection processing by the inspection device 73 of the present embodiment will be specifically described using FIG. 14 and FIG. 15. FIG. 14 is a schematic view illustrating an acquisition example of the optical information by the inspection device illustrated in FIG. 13. FIG. 15 is a diagram for explaining an acquisition example of specific optical information by the inspection device illustrated in FIG. 13.

In the inspection device 73 of the present embodiment, when step S21 described above is executed, the image taking unit 73*g* is disposed above the substrate 50, as illustrated in FIG. 14. Further, in the inspection device 73, as illustrated in FIG. 15, the image taking unit 73*g* is configured to acquire image data by taking an image of the entire face of the substrate 50 transported at a predefined transport speed in the H direction (transport direction of the substrate 50) in FIG. 14 and FIG. 15 by a transport device (not illustrated), from a front face side on which the carbide CB is formed.

Specifically, for example, as illustrated in FIG. 14, in the image taking unit 73*g*, a camera 73*g*1 described above takes an image of the upper face of the substrate 50 (the formed face of the carbide CB) from above. Further, as illustrated in FIG. 15, in the image taking unit 73*g*, the camera 73*g*1 (FIG. 14) is arranged in the orthogonal direction orthogonal to the transport direction (H direction), and the camera 73*g*1 performs image taking action in the orthogonal direction in accordance with the instruction signal from the control unit 73*c*, and outputs the image data to the detecting unit 73*d*.

Next, from the image data from the image taking unit 73*g*, the detecting unit 73*d* identifies whether or not a region of pixels having a pixel value greater than a threshold value exceeded the predetermined size described above (a number of pixels adjacent to each other, each having a pixel value greater than the threshold value) (step S22). The detecting unit 73*d*, upon detection that the region of the pixels described above is less than or equal to the predetermined size, identifies that the threshold value has not been exceeded (NO in step S22), and ends the processing.

On the other hand, the detecting unit 73*d*, upon detection that the region of the pixels described above is greater than the predetermined size, identifies that the threshold value was exceeded (YES in step S22). Then, the detecting unit 73*d* notifies the specifying unit 73*e* by a message communicating that the measurement result exceeded the threshold value. Furthermore, the detecting unit 73*d* outputs, along with the message described above, for example, an elapsed time from the start of image data acquisition (optical information acquisition) from the control unit 73*c* to detection that the threshold value was exceeded, and position information indicating the position of the region of the pixels detected as exceeding the threshold value (that is, the non-laser-irradiated region NL1 or the excessive residual carbide region NL2) to the specifying unit 73*e*.

Figure 16A:
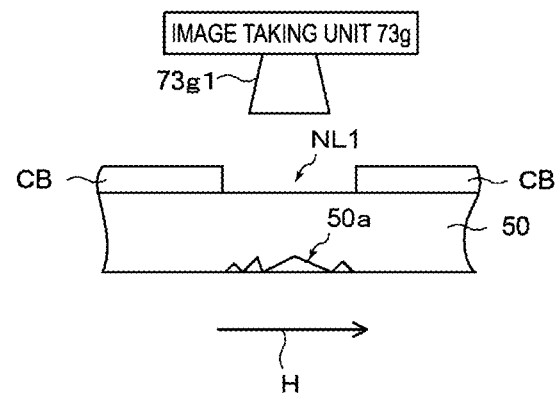
FIGS. 16A and 16B are schematic views illustrating an acquisition example by an image taking unit illustrated in FIG. 13.
Figure 16B:
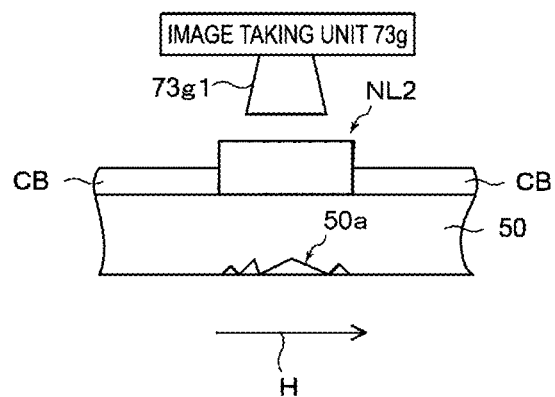

Here, a case that the region of the pixels described above exceeds the threshold value will be specifically described with reference to FIGS. 16A and 16B. FIGS. 16A and 16B are schematic views illustrating an acquisition example by the image taking unit illustrated in FIG. 13.

As illustrated in FIG. 16A, when the non-laser-irradiated region NL1 has occurred in the substrate 50, the light from the substrate 50 side led into the camera 73*g*1 is refracted and scattered by the damaged portion 50*a*, for example, decreasing the amount of light received by the camera 73*g*1 and increasing the pixel value.

Similarly, as illustrated in FIG. 16B, when the excessive residual carbide region NL2 has occurred in the substrate 50, the amount of light from the substrate 50 side led into and received by the camera 73*g*1 is decreased due to, for example, refraction by the damaged portion 50*a* and the excessive residual carbide region NL2, increasing the pixel value.

Thus, in the present embodiment, the detecting unit 73*d* can, similar to the first embodiment described above, detect the region NL described above having an acquisition result exceeding the threshold value using the image data of the image taking unit 73*g*. As a result, in the present embodiment as well, the specifying unit 73*e* can specify the display device 2*a* including the region NL, the identifying unit 73*f* can identify that the display device 2*a* is a defective product, and the collecting device 88 can, after separation by division in step S10 described above and before terminal exposure processing in step S11 described above, collect the display device 2*a* (individual piece) identified as a defective product. As a result, in the present embodiment, similar to the first embodiment, it is possible to prevent the processing after and including step S11 from being performed on an individual piece identified as a defective product, and reduce manufacturing cost while improving the manufacturing yield of the display device 2.

Further, in the present embodiment, the image data acquired by the image taking unit 73*g* is used as the optical information, making it possible to view the region NL described above (the non-laser-irradiated region NL1 or the excessive residual carbide region NL2) and save and store the image data in a storage unit (not illustrated) by displaying the image data on a display device (not illustrated), for example.

Further, while the description above has described a case that the disclosure is applied to an organic EL display device, the electro-optical element (an electro-optical element whose luminance and transmittance are controlled by an electric current) that is provided in the display device according to the present embodiment is not particularly limited. Examples of the display device according to the present embodiment include an organic electroluminescence (EL) display provided with the Organic Light Emitting Diode (OLED) as the electro-optical element, an inorganic EL display provided with an inorganic light emitting diode as the electro-optical element, and a Quantum dot Light Emitting Diode (QLED) display provided with a QLED as the electro-optical element.

The disclosure is not limited to the embodiments stated above. Embodiments obtained by appropriately combining technical approaches stated in each of the different embodiments also fall within the scope of the technology of the disclosure. Moreover, novel technical features may be formed by combining the technical approaches stated in each of the embodiments.

REFERENCE SIGNS LIST

2 Display device
4 TFT layer
5 Light emitting element layer
6 Sealing layer
7 Layered body
10 Lower face film
12 Resin layer
50 Substrate
70 Display device manufacturing apparatus

The invention claimed is:

1. A manufacturing method of a display device in which, after a layered body including a resin layer, a TFT layer, and a light emitting element layer is formed on a substrate configured to form a plurality of display devices, the resin layer is irradiated with laser from a back face of the substrate and the substrate is peeled from the layered body using a laser peeling device, the manufacturing method of a display device comprising:
   acquiring optical information of the substrate that is peeled off;
   detecting each acquisition result of the plurality of display devices from each assigned position of the plurality of display devices relative to the substrate; and
   performing predetermined processing on the display device in a case that the acquisition result of the display device exceeds a threshold value.

2. The manufacturing method of a display device according to claim 1, wherein the optical information is transmittance.

3. The manufacturing method of a display device according to claim 1, wherein the optical information is reflectivity.

4. The manufacturing method of a display device according to claim 1, wherein the optical information is image data.

5. The manufacturing method of a display device according to claim 1, wherein, after the substrate has been peeled off, a lower face film is bonded to the resin layer, and the layered body and the lower face film are both divided to obtain the plurality of display devices.

6. The manufacturing method of a display device according to claim 1, wherein the predetermined processing includes an identifying step for specifying, in a case that an acquisition result exceeding a predetermined threshold value is detected, the display device indicating the acquisition result exceeding the threshold value from the plurality of display devices, and identifying that the specified display device is a defective product.

7. The manufacturing method of a display device according to claim 6, wherein the predetermined processing further includes a collecting step for collecting the display device identified as the defective product.

8. The manufacturing method of a display device according to claim 6, wherein the predetermined processing further includes notifying an external source that the acquisition result of the display device identified as the defective product exceeded the threshold value, and of information indicating the display device.

9. The manufacturing method of a display device according to claim 1, wherein the substrate is peeled from the layered body by inserting a knife from an end face of the layered body.

10. The manufacturing method of a display device according to claim 1, wherein the resin layer includes a polyimide.

11. The manufacturing method of a display device according to claim 1, wherein, in the acquiring the optical information, an inspection device measures the substrate that is peeled off from the layered body to acquire the optical information of the substrate that is peeled off from the layered body.

12. The manufacturing method of a display device according to claim 1, wherein, in the detecting each acquisition result of the plurality of display devices, each acquisition result of the plurality of display devices is detected based on the optical information acquired in the acquiring the optical information and each assigned position of the plurality of display devices relative to the substrate.

13. A manufacturing apparatus of a display device in which, after a layered body including a resin layer, a TFT layer, and a light emitting element layer is formed on a substrate configured to form a plurality of display devices, the resin layer is irradiated with laser from a back face of the substrate and the substrate is peeled from the layered body using a laser peeling device, the manufacturing apparatus of a display device being configured to:
   acquire optical information of the substrate that is peeled off,
   detect each acquisition result of the plurality of display devices from each assigned position of the plurality of display devices relative to the substrate, and
   perform predetermined processing on the display device in a case that the acquisition result of the display device exceeds a threshold value.

14. The manufacturing apparatus of the display device according to claim 13, further comprising an inspection device configured to measure the substrate that is peeled off from the layered body to acquire the optical information of the substrate that is peeled off from the layered body.

15. The manufacturing apparatus of the display device according to claim 13, further comprising an inspection device configured to detect each acquisition result of the plurality of display devices, based on the optical information acquired and each assigned position of the plurality of display devices relative to the substrate.

* * * * *